United States Patent
Shiraishi

(10) Patent No.: US 9,183,143 B2
(45) Date of Patent: *Nov. 10, 2015

(54) MEMORY DEVICE THAT SPECIFIES A SIZE OF A SEGMENT OF WRITE DATA

(75) Inventor: Atsushi Shiraishi, Kawasaki (JP)

(73) Assignee: KABUSHIKI KAISHA TOSHIBA, Tokyo (JP)

( * ) Notice: Subject to any disclaimer, the term of this patent is extended or adjusted under 35 U.S.C. 154(b) by 22 days.

This patent is subject to a terminal disclaimer.

(21) Appl. No.: 13/422,378

(22) Filed: Mar. 16, 2012

(65) Prior Publication Data

US 2013/0036339 A1    Feb. 7, 2013

(30) Foreign Application Priority Data

Aug. 1, 2011   (JP) .................................. 2011-168552
Feb. 7, 2012   (JP) .................................. 2012-024187

(51) Int. Cl.
*G11C 29/00* (2006.01)
*G06F 12/04* (2006.01)

(52) U.S. Cl.
CPC ....... *G06F 12/04* (2013.01); *H01L 2224/48091* (2013.01); *H01L 2224/48145* (2013.01); *H01L 2224/49175* (2013.01); *H01L 2225/06562* (2013.01); *H01L 2924/13091* (2013.01)

(58) Field of Classification Search
CPC ............ G06F 11/1076; G06F 11/1008; G06F 11/1068; G06F 11/1044; H05K 999/99; H01L 2224/00014; H01L 2224/48091; H01L 2224/48145; H01L 2224/49175; H01L 2225/06562; H01L 2924/00; H01L 2924/13091

See application file for complete search history.

(56) References Cited

U.S. PATENT DOCUMENTS

| 6,725,321 B1* | 4/2004 | Sinclair et al. ................ 711/103 |
| 6,725,322 B1 | 4/2004 | Shiraishi et al. |
| 2003/0172229 A1* | 9/2003 | Takasugi et al. .............. 711/112 |
| 2003/0200363 A1* | 10/2003 | Futral ............................ 710/23 |
| 2006/0059297 A1* | 3/2006 | Nakanishi et al. ............ 711/103 |

(Continued)

FOREIGN PATENT DOCUMENTS

| JP | 2003-91704 | 3/2003 |
| JP | 2008-234514 | 10/2008 |

(Continued)

OTHER PUBLICATIONS

Office Action issued Feb. 14, 2013 in Korean Patent Application No. 10-2012-0025570 with English language translation.
JEDEC Standard, Universal Flash Storage (UFS), JESD220, JEDEC Solid State Technology Association, Feb. 2011, 260 pages.

(Continued)

*Primary Examiner* — Albert Decady
*Assistant Examiner* — Enamul M Kabir
(74) *Attorney, Agent, or Firm* — Oblon, McClelland, Maier & Neustadt, L.L.P.

(57) ABSTRACT

According to the embodiments, a memory device includes a memory to which data is written using memory cells as a write unit and a controller which controls the memory. In response to a request to write data with a logical address to the memory from a host device, the controller requests the host device to transmit a segment of the write data with a size specified by the controller. The controller writes the write data with additional data to the memory. The write-data segment has a size determined to allow the combined size of the write-data segment and corresponding additional data to be the largest while smaller than the size of the write unit or has a multiple integral of the size.

19 Claims, 13 Drawing Sheets

(56) References Cited

U.S. PATENT DOCUMENTS

| | | | |
|---|---|---|---|
| 2006/0277388 A1* | 12/2006 | Paley et al. | 711/173 |
| 2007/0300130 A1* | 12/2007 | Gorobets | 714/766 |
| 2008/0244368 A1* | 10/2008 | Chin et al. | 714/800 |
| 2008/0294966 A1* | 11/2008 | Kuroishi et al. | 714/776 |
| 2009/0216937 A1* | 8/2009 | Yasufuku | 711/103 |
| 2009/0307427 A1 | 12/2009 | Takasuka et al. | |
| 2010/0011158 A1 | 1/2010 | Shiraishi et al. | |
| 2011/0191654 A1* | 8/2011 | Rub | 714/773 |
| 2012/0110417 A1* | 5/2012 | D'Abreu et al. | 714/773 |

FOREIGN PATENT DOCUMENTS

| | | |
|---|---|---|
| JP | 2009-205411 A | 9/2009 |
| WO | WO 2007/116476 A1 | 10/2007 |

OTHER PUBLICATIONS

Office Action issued Jan. 10, 2014, in Korean Patent Application No. 10-2012-0025570 with English translation.

Office Action mailed Mar. 10, 2014 in Taiwanese Application No. 101107020 (w/English translation).

Japanese Office Action issued Sep. 9, 2014, in Japan Patent Application No. 2012-024187 (with English translation).

Taiwanese Office Action issued Sep. 30, 2014, in Taiwan Patent Application No. 101107020 (with English translation).

Office Action issued on Oct. 30, 2014 in Chinese Patent Application No. 201210070944.7 with English translation.

Chinese Office Action issued on Jul. 14, 2015, in Chinese Patent Application No. 201210070944.7 (English translation provided). Ax Ay.

* cited by examiner

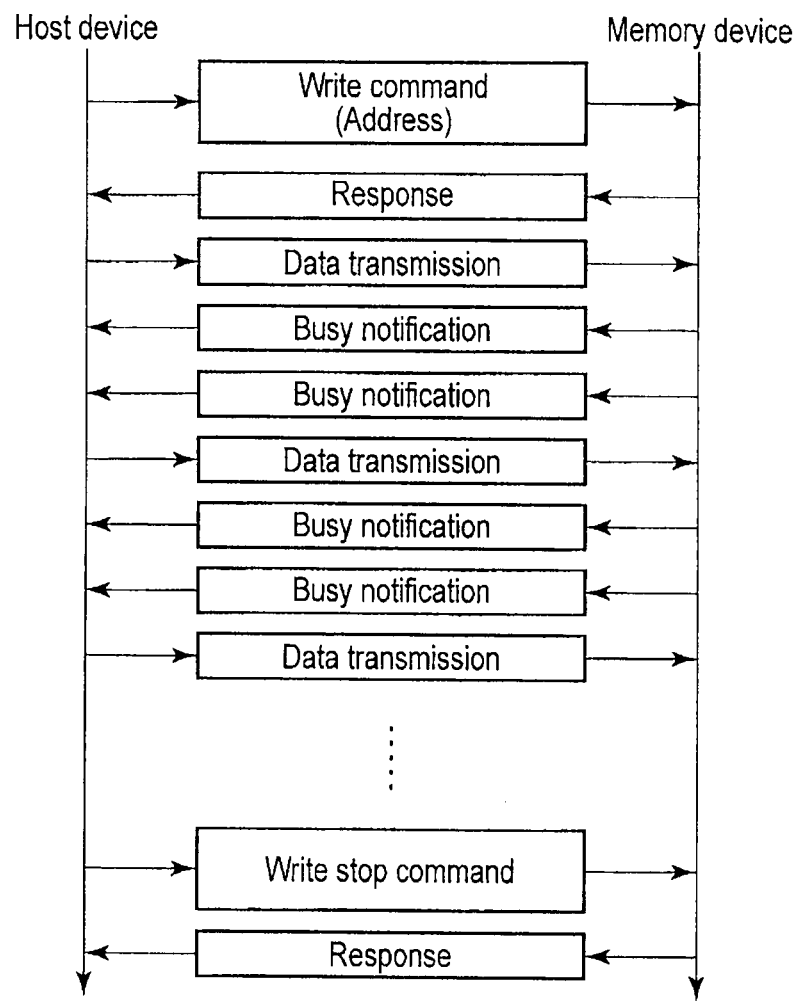
F I G. 1

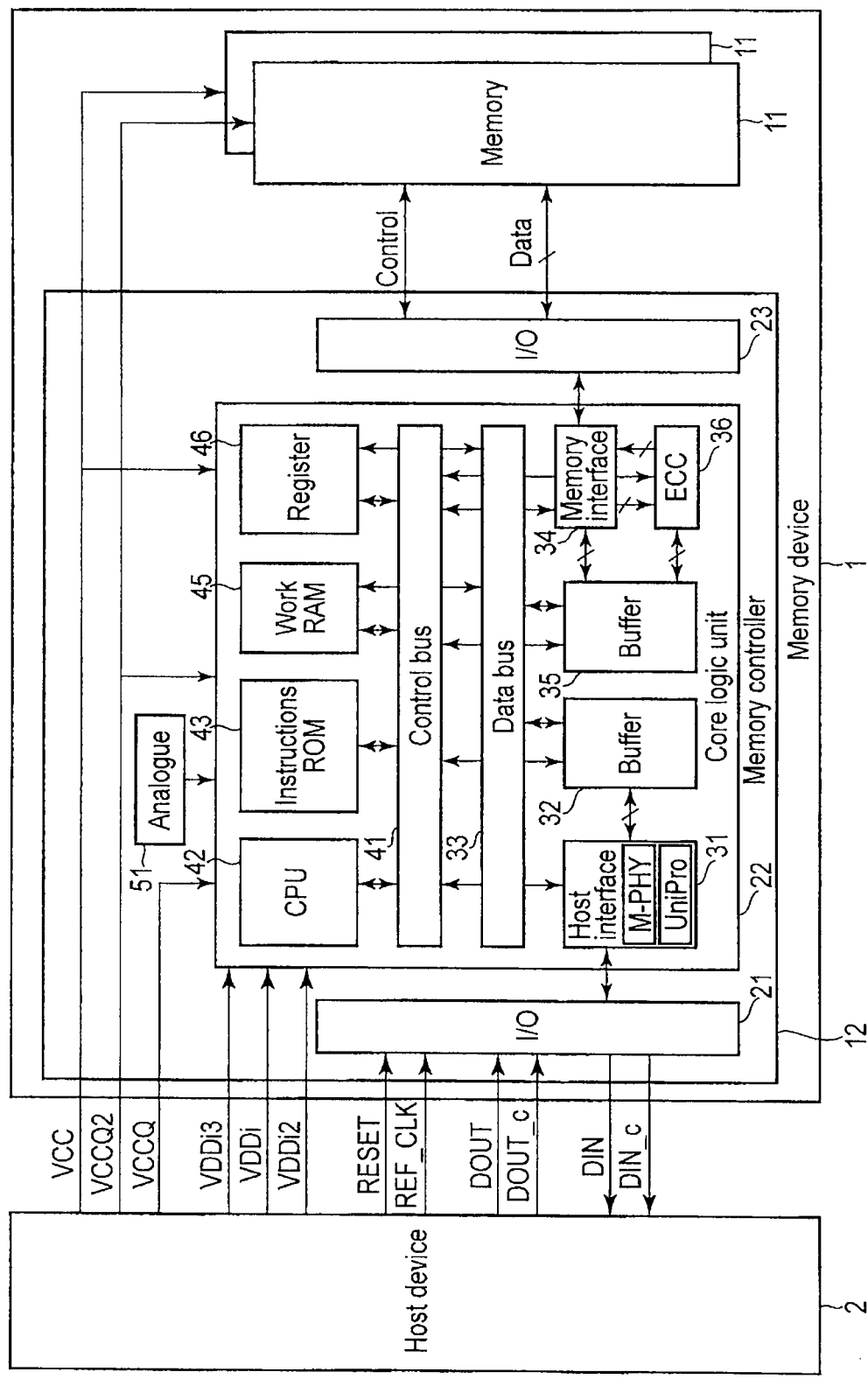
F I G. 3

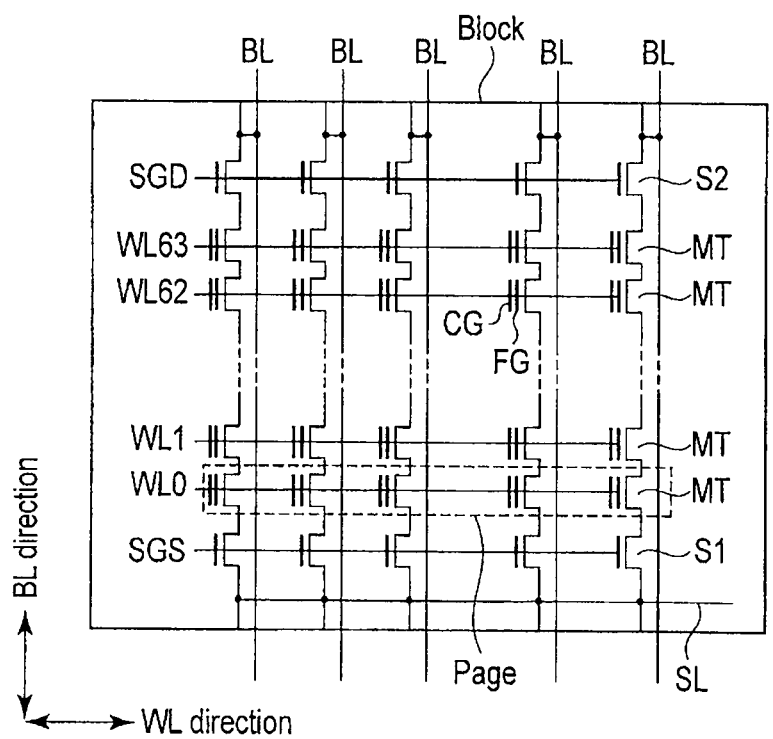
F I G. 4
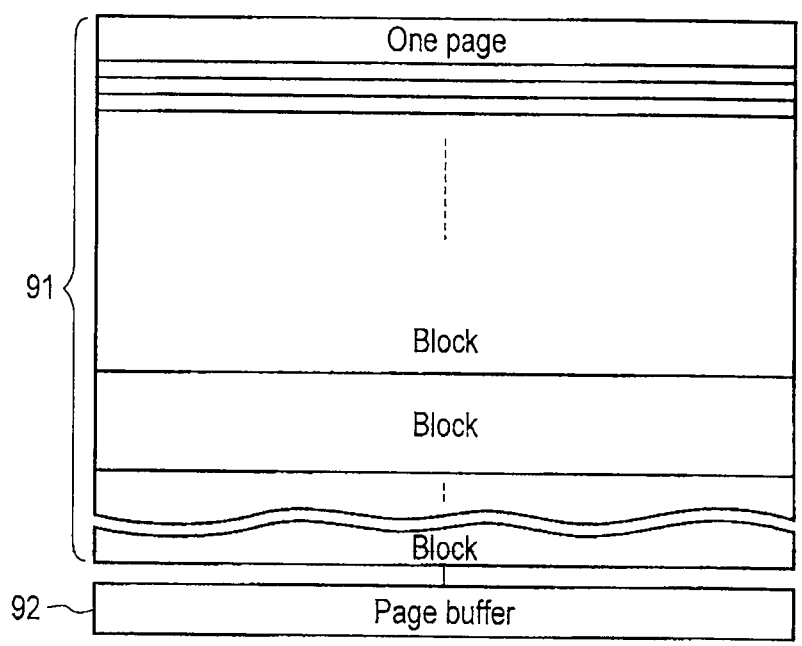
F I G. 5

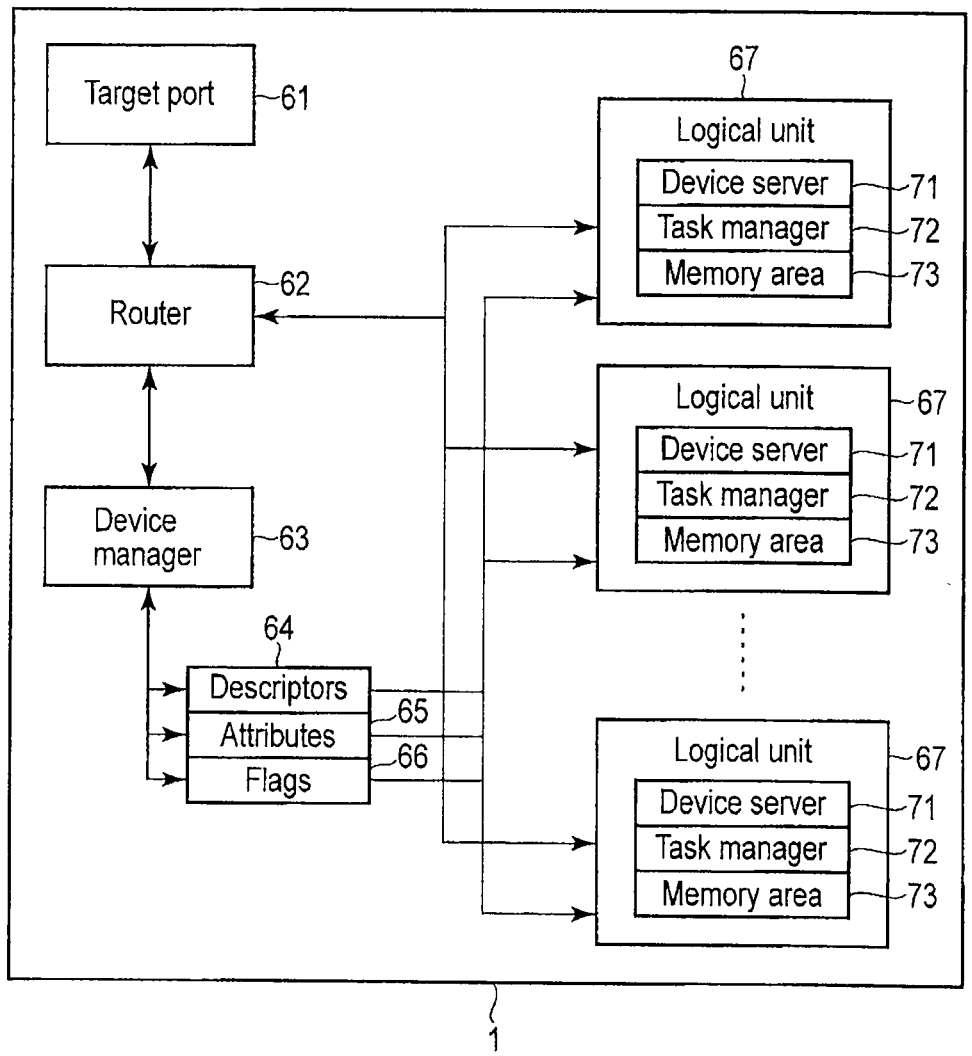
F I G. 7

| Logical address | Physical (block) address |
|---|---|
| 0x0000_0x0FFF | 0x0001 |
| 0x1000_0x1FFF | 0x0005 |
| 0x2000_0x2FFF | 0x0100 |
| 0x3000_0x3FFF | 0x0A00 |
| 0x4000_0x4FFF | 0x0003 |
| 0x5000_0x5FFF | 0x0123 |
| ... | ... |

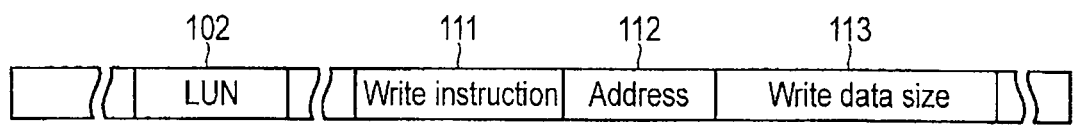
F I G. 1 2
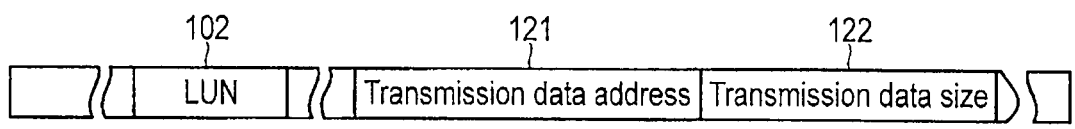
F I G. 1 3
F I G. 1 4

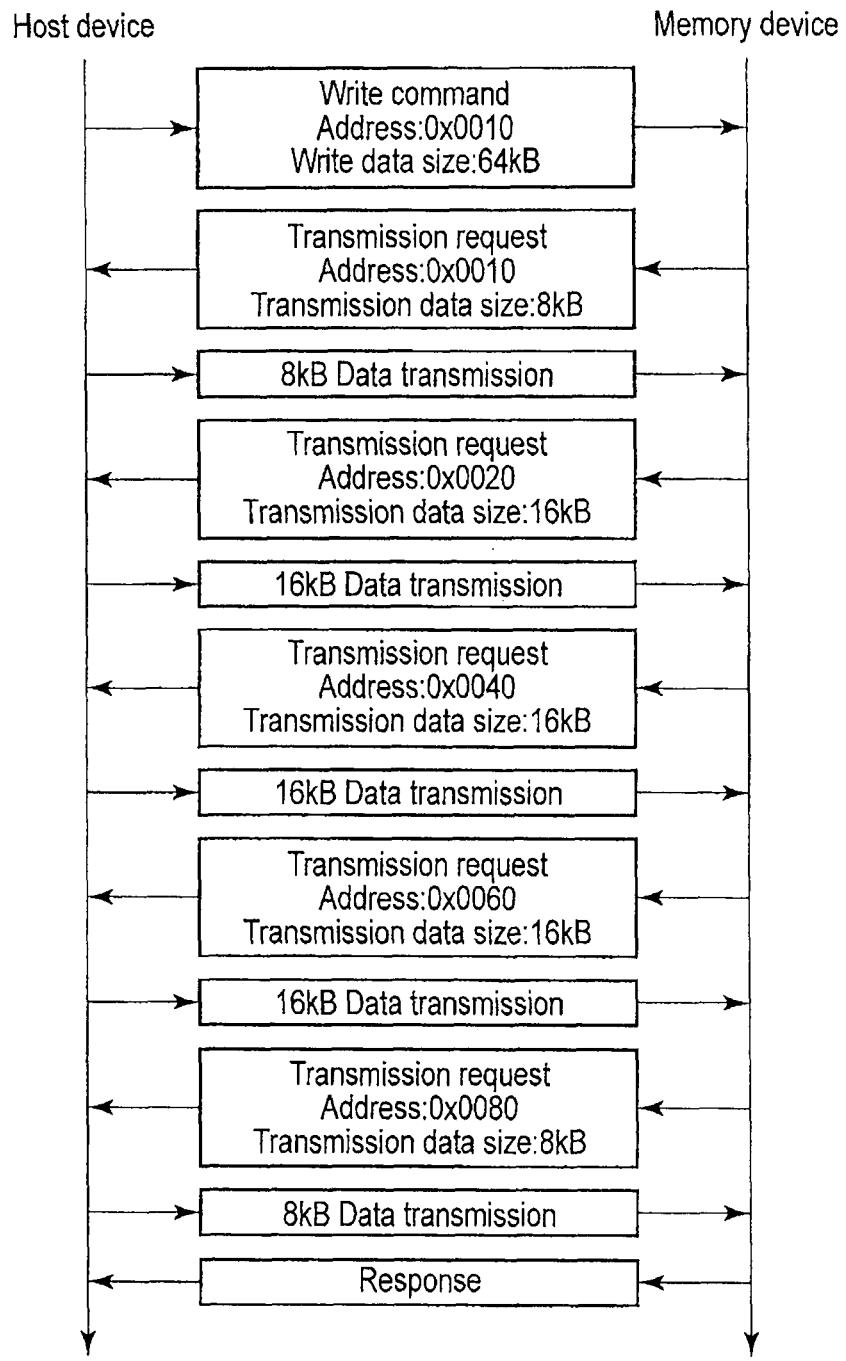
F I G. 15

MEMORY DEVICE THAT SPECIFIES A SIZE OF A SEGMENT OF WRITE DATA

CROSS-REFERENCE TO RELATED APPLICATIONS

This application is based upon and claims the benefit of priority from prior Japanese Patent Applications No. 2011-168552, filed Aug. 1, 2011; and No. 2012-024187, filed Feb. 7, 2012, the entire contents of all of which are incorporated herein by reference.

FIELD

Embodiments described herein relate generally to a memory device.

BACKGROUND

There are many kinds of media for storing data. One such medium is a memory device based on a client/server model. A memory system which includes a memory device and a host device based on the client/server model differs from another memory system in several regards. For example, roles assumed by the memory device and the host device based on the client/server model are different from those based on a non-client/server model. Therefore, transmissions between the host device and the memory device also differ between the client/server-model system and another system.

A memory system may need to comply with a specific standard. One of memory systems based on the client/server model may include a universal flash storage (UFS) memory device and its host device. Respects defined by a standard need to be satisfied. There are, however, also regards not defined by the standard and a designer of the memory system can determine them. Such flexible matters should be determined to realize desirable performance with characteristics suitable for the memory system. There are demands for a memory device with increased performance with such flexible design matters properly determined.

BRIEF DESCRIPTION OF THE DRAWINGS

FIG. 1 illustrates an example of communications during writing between a memory device and a host device.

FIG. 3 illustrates a hardware configuration of a memory device according to a first embodiment.

FIG. 4 illustrates a circuit diagram of a memory.

FIG. 5 illustrates a structure of memory space.

FIG. 7 illustrates functional blocks of the memory device according to the first embodiment.

FIG. 12 illustrates a write command.

FIG. 13 illustrates a communication for a transmission request.

FIG. 14 illustrates communications for data transmission.

FIG. 15 illustrates communications during writing according to a second embodiment.

DETAILED DESCRIPTION

In general, according to one embodiment, a memory device includes a memory to which data is written using memory cells as a write unit and a controller which controls the memory. In response to a request to write data with a logical address to the memory from a host device, the controller requests the host device to transmit a segment of the write data with a size specified by the controller. The controller writes the write data with additional data to the memory. The write-data segment has a size determined to allow the combined size of the write-data segment and corresponding additional data to be the largest while smaller than the size of the write unit or has a multiple integral of the size.

Prior to describing embodiments, an example of a memory system based on the client/server model and a non-client/server-model memory system will be described for reference. An SD™ card and eMMC are taken for an example for the non-client/server-model memory. FIG. 1 illustrates an example of communications between a memory device such as an SD™ card or eMMC and a host device during writing. The host device issues a write command to initiate writing as shown in FIG. 1. A write command contains the logical address assigned to data to be written. The logical address specifies the start position of such data. The memory device transmits back a response when it receives the write command. The host device transmits the to-be-written data (write data) in the memory device when it receives the response. The write data is segmented and transmitted as write-data segments. The size of a write-data segment is defined in accordance with the standard of the SD™ card or eMMC. While the memory device is ready for receiving data, it reports its ready state using a ready/busy signal. The memory device writes received data items to the memory in the memory device sequentially. When the memory device can accept no more data due to, e.g., its buffer being full, it reports its busy state to the host device. The host device interrupts data transmission while the memory device is in the busy state. Once the busy state is cleared, the host device resumes transmission of the next write-data segment. Thus, once the whole write data is transmitted, the memory device transmits a write stop command. Upon reception of the write stop command, the memory device transmits back a response.

Thus, the position of the write data is designated by the host device, and its size is defined by the standard. In other words, the host device has initiative of data transmission and issues instructions, which are followed by the memory device, in the memory system of the example for reference. The memory device has a small flexibility.

Figure 2:
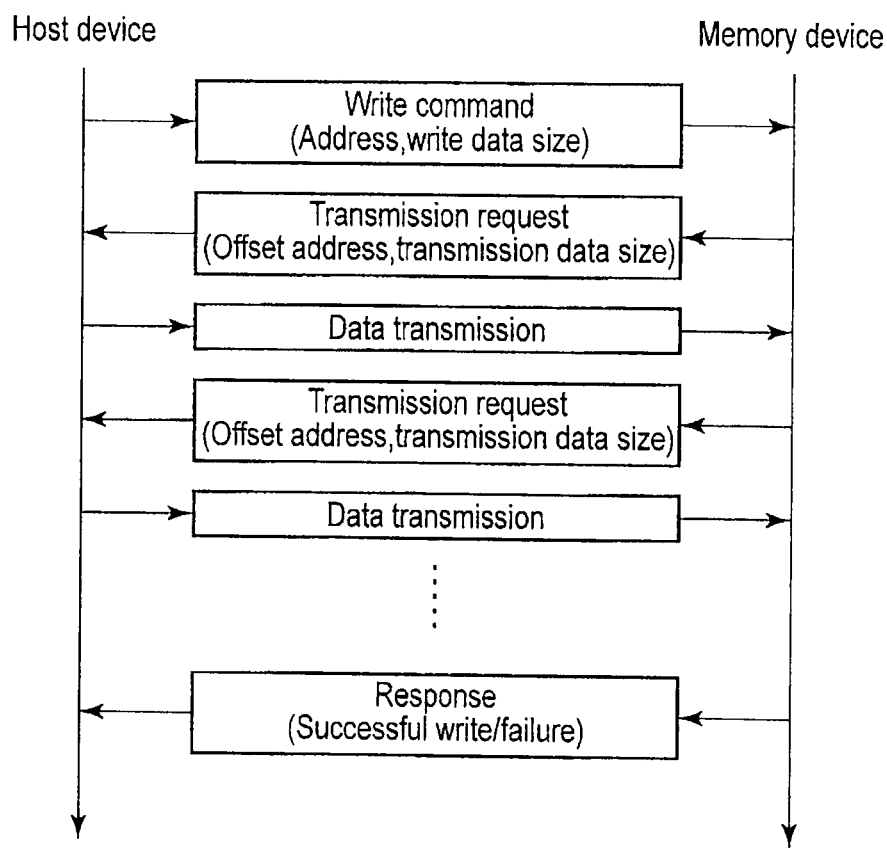
FIG. 2 illustrates an example of communications during writing between a memory device and a host device which are based on the client/server model for reference.

FIG. 2 illustrates an example of communications between a memory device and a host device based on the client/server model during writing. As shown in FIG. 2, the host device issues a write command to initiate writing. The write command contains the logical address for specifying the write data, and the information on the size of the write data associated with the write command. Upon reception of the write command, the memory device determines contents of a request to transmit the write data. The transmission request contains the size and the offset address for a segment of the write data which the memory device requires the host device to transmit. The offset address specifies the position of the segment which the memory device requires to transmit. Upon reception of the transmission request, the host device transmits the requested data segment to the memory device. The memory device writes the received data segment to the memory and transmits the next transmission request for the next data segment. This writing and transmission of transmission request are repeated until the whole write data is written. Based on a success or failure of the writing of whole write data, the memory device transmits a corresponding response to the host device.

Thus, in the example of FIG. 2, the memory device determines the write-data segment and transmits the transmission request. Such writing scheme involves some details defined by the standard and others not defined. Specifically, the host device may have an authority to determine whether the offset addresses in respective transmission requests from the memory device should be sequential ones or random, and the selection of the offset address must follow this rule. In contrast, the standard may not define the write-data-segment size specified by the transmission request.

Embodiments configured in accordance with such background will now be described with reference to drawings. Components which have substantially the same function and a configuration have the same reference number, and duplicate description is given only when required, in the following description. Embodiment described below illustrates devices and methods for embodying technical idea of embodiments. The technical idea of embodiments does not limit details to the following examples. The technical idea of the embodiments may be variously changed in accordance with the scope of the claims.

First Embodiment

FIG. 3 schematically illustrates a memory device according to a first embodiment. FIG. 3 illustrates a hardware configuration of the memory device. A memory device (semiconductor memory device) 1 is configured to communicate with a host device 2, which may be referred to as a host 2 hereinafter, as shown in FIG. 3. The memory device 1 and the host 2 communicate through a communication scheme which at least allows the memory device 1 to specify a size and a segment of write data in response to a write request from the host 2. Particularly, the memory device 1 and the host 2 communicate in accordance with the client/server model. The memory device 1 serves as a target and the host 2 as an initiator. More particularly, the memory device 1 may be a UFS memory device, and the host 2 a host which supports the UFS memory device.

The memory device 1 includes at least a nonvolatile semiconductor memory 11 and a memory controller 12 for controlling the memory 11. The memory 11 writes or reads data in write units each having a specific number of bits. The memory 11 also erases data in erase units each having a specific number of write units.

Particularly, the memory 11 may include one or more NAND flash memories. In a case for the memory 11 being the NAND flash memory, the memory 11 writes or reads data in units of pages. As shown in FIG. 4, one page includes memory space formed by a group of mutually-coupled memory cells, and is assigned a unique physical address. Each memory cell includes a metal oxide semiconductor field-effect transistor (MOSFET) MT with a so-called stacked gate structure. Each cell transistor MT has varying threshold voltages according to the number of electrons stored in a floating gate electrode FG, and stores information according to the threshold voltage. The cell transistors MT have their respective current paths (source/drain SD) serially-connected to form a NAND string, and select transistors S1 and S2 are coupled to one NAND string's both ends. The other end of the current path of the select transistor S2 is coupled to a bit line BL, and the other end of the current path of the select transistor S1 is coupled to a source line SL.

The word lines WL0 to WL63 extend in the WL direction, and are coupled to the control gate electrode CG of each cell transistor MT in the same row. The cell transistor MT is provided at each intersection between the bit lines BL and the word lines WL. The select gate line SGD extends in the WL direction, and is coupled to all select transistors S2 in one block. The select gate line SGS extends in the WL direction, and is coupled to all select transistors S1 in one block. Memory cell transistors MT coupled to the same word line WL form one page.

For a case of the memory 11 being the NAND flash memory, each cell transistor MT can take multiple threshold voltages, that is, the memory 11 can be configured to store multiple levels (multiple bits) in one memory cell. For such a memory which can store multiple levels in a cell, two or more pages are assigned to one word line.

As shown in FIG. 5, the memory 11 includes a memory cell array 91 of memory cells, and a page buffer 92, which outputs and inputs data to and from memory cells. The page buffer 92 buffers data of one-page size. For writing data to the memory 11, the memory controller 12 transmits to the memory 11 a write command as well as write data of one-page size and a page address to which the data will be written. The memory 11 buffers the write data received from the memory controller 12 in the page buffer 92 and writes the buffered data to the memory cells specified by the page address. Upon the start of writing to the memory cells, the memory 11 outputs a busy signal to the memory controller 12 to indicate that it is in operation. For further writing, after the busy signal turns into a ready signal, the same operation as described above is repeated for one or more subsequent page addresses.

For reading data from the memory 11, the memory controller 12 transmits to the memory 11 a read command as well as a page address from which the data will be read. The memory 11 reads the data of one-page size from the memory cells specified by the page address to the page buffer 92. Upon the start of reading from the memory cells, the memory 11 outputs the busy signal to the memory controller 12. After the busy signal turns into the ready signal, the read data buffered in the page buffer 92 is output to the memory controller 11. For further reading, the same operation as described above is repeated for one or more subsequent page addresses.

For a case of the memory 11 being the NAND flash memory, the memory 11 erases data in units of blocks. Each block includes pages which have sequential physical addresses. The following description assumes that a write unit is a page and an erase unit is a block for the purpose of convenience; however, the memory 11 is not necessarily limited to the NAND flash memory.

Referring back to FIG. 3, the memory device 1 includes an I/O 21, a core logic unit 22, and an I/O 23.

The I/O 21 includes a hardware configuration to allow the memory device 1 to be coupled to the host 2. For a case of the memory device 1 being a UFS memory device, signals transmitted between the memory device 1 and the host 2 include RESET, REF_CLK, DOUT, DOUT_c, DIN, DIN_c, VCC, VCCQ, VCCQ2, VDDi, VDDi2 and VDDi3. RESET, REF_CLK, DOUT, DOUT_c, DIN and DIN_c are communicated between the host 2 and I/O 21. RESET is a hardware reset signal. REF_CLK is a reference clock. DOUT and DOUT_c form a differential signal pair and are transmitted to the memory device 1 from the host 2. DIN and DIN_c form a differential signal pair and are transmitted to the host 2 from the memory device 1. VCC, VCCQ, and VCCQ2 are voltages supplied to the memory 11 and the core logic unit 22. VDDi, VDDi2, and VDDi3 are supplied to the core logic unit 22, and are input terminals for application which includes a voltage regulator in the core logic unit 22.

The core logic unit 22 is the main part of the memory controllers 12 except the I/O 23. The I/O 23 includes a hardware configuration to allow the memory controller 12 to be coupled to the memory 11. The core logic unit 22 includes a host interface 31, a buffer 32, a data bus 33, a memory interface 34, a buffer 35, an error correction code (ECC) circuit 36, a control bus 41, a central processing unit (CPU) 42, a read only memory (ROM) 43, a work random access memory (RAM) 45, and a register 46.

The I/O 21 is coupled to the host interface 31. The host interface 31 performs processing for the memory device 1 and the host 2 to communicate. Specifically, the host interface 31 is responsible for communication between the memory device 1 and the host 2 in accordance with a communications protocol with which both the memory device 1 and the host 2 comply. For a case of the memory device 1 being a UFS memory device, the host interface 31 is the UFS interface, for example. The UFS interface complies with the M-PHY standard for the physical layer, and the UniPro standard for the link layer.

The host interface 31 is coupled to the buffer 32. The buffer 32 receives data transmitted to the memory device 1 from the host 2 through the host interface 31, and buffers it. The buffer 32 also buffers data to be transmitted to the host 2 through the host interface 31 from the memory device 1. The buffer 32 is coupled to the data bus 33.

The I/O 23 is coupled to the memory interface 34. The memory interface 34 performs processing for the memory controller 12 to communicate with the memory 11. Specifically, the memory interface 34 transmits instructions received from the core logic section 22 in a form recognizable by the memory 11. For a case of the memory 11 being the NAND flash memory, the memory interface 34 is a NAND flash interface.

The memory interface 34 is coupled to the buffer 35. The buffer 35 receives data transmitted to the memory controller 12 from the memory 11 through the memory interface 34, and buffers it. The buffer 35 also buffers data to be transmitted to the memory 11 through the memory interface 34 from the memory controller 12. The buffer 35 is coupled to the data bus 33. The memory interface 34 and the buffer 35 are coupled to the ECC circuit 36. The ECC circuit 36 is also coupled to the data buffer 35. The ECC circuit 36 receives the write data from the host 2 through the data bus 33, adds an error correction code to the write data, and provides the buffer 35 with the write data with the error correction code. The ECC circuit 36 also receives data from the memory 11 through the buffer 35, and uses the error correction code to error-correct the received data, and provides the data bus 33 with the error-corrected data.

The CPU 42, ROM 43, RAM 45, and register 46 are coupled to the control bus 41. The CPU 42, ROM 43, RAM 45, and register 46 communicate through the control bus 41. The CPU 42 manages the whole operation of the memory device 1. The CPU 42 performs processing based on the control program (commands) stored in the ROM 43. The CPU 42 performs processing for the memory 11 in accordance with commands received from the host 2 based on the control program.

The ROM 43 stores the control program executed by CPU 42, for example. The RAM 45 is used as a work area for the CPU 42 and temporarily stores variables for the CPU 42, for example. The register 46 stores various values for operation of the memory device 1. The register 46 also stores various values for the host 2 to control the memory device 1.

The host interface 31, buffer 32, memory interface 34, and buffer 35 are coupled to the control bus 41. The CPU 42 controls the host interface 31, buffer 32, memory interface 34, and buffer 35 based on the control program and the instructions from the host 2. An analog circuit 51 may be provided in the memory controller 12.

Figure 6:
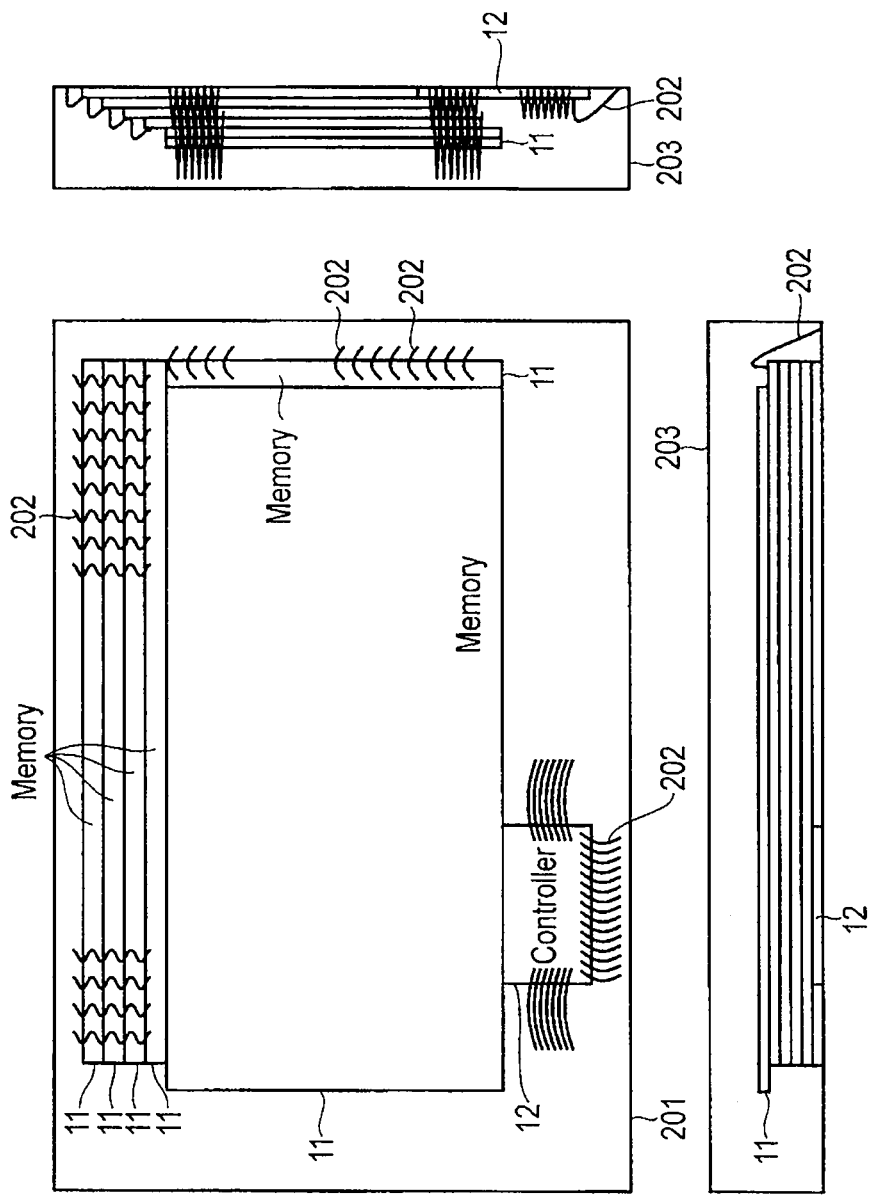
FIG. 6 illustrates an example configuration of a sealed memory device.

The memory device 1 may be an embedded type with which it is mounted on a printed circuit board with solder, or a removable type with which it is removable from a card slot in the host 2. FIG. 6 illustrates an example of the memory device 1 in a sealed form. One or more memories 11 each in chip form are mounted on a printed circuit board 201 as shown in FIG. 6. Memories 11 are coupled to a circuit pattern (not shown) on the printed circuit board 201 by wires 202. A memory controller 12 in chip form is also placed on the printed circuit board 201, and is coupled to the circuit pattern by the wires 202. External terminals (not shown) such as a ball grid array (BGA) are provided on the back of the printed circuit board 201. The signals shown in FIG. 3, i.e., RESET, REF_CLK, DOUT, DOUT_c, DIN, DIN_c, VCC, VCCQ, VCCQ2, VDDi, VDDi2, VDDi3 are assigned to the external terminals, through which assigned signals are communicated with the host 2 outside the memory device 1. The printed circuit board 201, memory 11, memory controller 12, and wires 202 are sealed by a package 203 made of resin, for example.

Referring to FIG. 7, another aspect of a configuration of the memory device 1 is illustrated. Specifically, FIG. 7 illustrates a logical configuration of the memory device 1, i.e., functional blocks thereof. Each functional block may be implemented as hardware, computer software, or combination of the both. Whether each functional block is implemented as hardware or software depends on the particular application and design constraints imposed on the overall system. Those skilled in the art may implement the functional blocks in varying ways for each particular application, but any implementation approach is included in the scope of the embodiment. Moreover, it is not essential that each functional block is distinguished like the following examples. For example, some functions may be performed by a functional block other than the functional block illustrated in the following description. Illustrated blocks may be divided into smaller functional sub block. The embodiment is not limited by which block assumes a particular function.

Figures 8, 9:
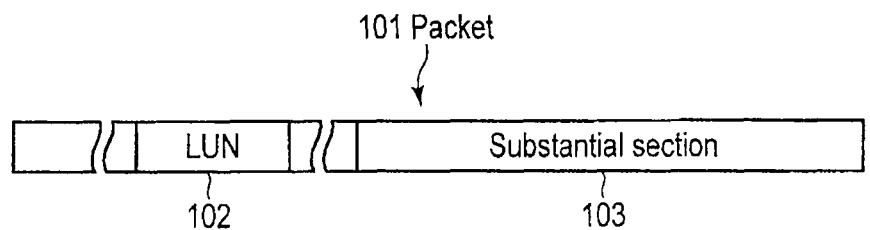
FIG. 8 illustrates an example of a packet.
FIG. 9 illustrates an example of a table for translating logical addresses and physical blocks.

The memory device 1 includes a target port 61, a router 62, a device manager 63, descriptors 64, attributes 65, flags 66, and two or more logical units (LUs) 67. The target port 61 is a port for the memory device 1 to be communicatively coupled to the host 2 and corresponds to the host interface 31, for example. The router 62 routes a communication such as a task, a command, data, or a query received from the host 2 to an addressed LU 67. The host 2 requests processing specified by a command or task management function through a request with one LU 67 addressed. The LUs 67 can be identified by addresses such as logical unit number (LUN). The LUN can be included in the communication (packet) transmitted and received between the memory device 1 and the host 2 as shown in FIG. 8. A packet 101 includes the LUN 102 and a substantial section 103 as shown in FIG. 8. The LUN 102 can be included in a header of the packet 101, for example. The substantial section 103 includes unique contents based on a function of the packet, such as a command, data, and various kinds of parameters. The LU 67 addressed by each packet is identified by the LUN therein. For the UFS memory device, each packet transmitted and received between the memory device 1 and the host 2 includes the header, which contains the LUN.

The router 62 routes the communication such as a task, a command, data, or query received from the host 2 to the addressed LU 67 based on the LUN in this communication. The router 62 transmits the communications destined to the host 2 and received from LUs 67 to the target port 61 in a suitable order based on the time sharing, for example. The router 62 may be implemented by the CPU 42, ROM 43, and register 46. Specifically, it may be implemented by the program in the ROM 43 executed by the CPU 42 with values in the register 46 referred.

The device manager 63 manages device-level operation and configuration. The device-level management may include control of power and sleep of memory device 1. The device-level configuration may include holding of a set of descriptors. The device manager 63 process a command such as a query request from the host 2, which requests update and output of configuration information of the memory device 1. The device manager 63 may be implemented by the CPU 42, ROM 43, and register 46. Specifically, it may be implemented by the program in the ROM 43 executed by the CPU 42 with values in the register 46 referred.

The descriptors 64, attributes 65, and flags 66 may be implemented as data in the work RAM 45. The descriptors 64 have the data structure in a defined format, and are for describing one or more features of the memory device 1. The descriptors 64 may include a device class, a subclass, and a protocol necessary for the memory device to be accessed. The attributes 65 are configurable or read-only parameters and describe settings given to the memory device 1. The attributes 65 may include the possible largest size of data which can be transmitted and received between the memory device 1 and the host 2. The flags 66 may include alternative logical values for various items, and each may represent "true" or "false", or "1" or "0".

Each LU 67 may be implemented by the memory 11, memory interface 34, buffer 35, ECC circuit 36, CPU 42, ROM 43, and register 46. Each LU 67 independently performs processing requested by the host 2. Each LU 67 is implemented by part of resources provided by the memory 11, interfaces 21 and 23, buffer 35, ECC circuit 36, CPU 42, ROM 43, and register 46. LUs are distinguished one from another by the host 2 as described above by the LUN identifying one LU. The command from the host 2 is executed by the specified LU 67.

Each LU 67 includes a device server 71, a task manager 72, and memory area 73. The memory area 73 includes part of the memory area of the memory 11, and actually stores write data received from the host 2. The device server 71 and task manager 72 may be implemented by the CPU 42, ROM 43, and register 46. Specifically, it may be implemented by the program in ROM 43 executed by the CPU 42 with values in the register 46 referred. The device server 71 interprets and performs a command which requests LU-level processing received from the host 2. Such processing may include writing, reading, or erasing data. Since LUs 67 include respective memory areas 73, the device server 71 can has at least a function to control the memory area 73 (memory 11). The task manager 72 controls an order of execution of commands (, or tasks) and offers task management.

As described above, the device server 71 performs processing for control the memory 11. Such processing may include translation of a logical address and a physical address. A logical address is assigned by the host 2 to data which the host 2 requests to write to the memory device 1. A physical address identifies a write area (or page) or an erase area (or block) in the memory 11 as described above. The device server 71 manages a state of data stored in its memory area 73. The management of the memory state includes managing a correspondence between a page (, or a physical block) of a physical address and the logical address of the data stored in this page, and managing which physical address page (, or physical block) is erased (, or stores no or invalid data). For such management, the device server 71 may store a table for translating between logical addresses and physical addresses (hereinafter referred to as a translation table).

As an example of the translation, blocks may be used for assignment as shown in FIG. 9. A fixed logical address offset is assigned to each page in each block. FIG. 9 illustrates an example of a logical address assigned to each 512-byte data-item with write-unit size of the memory 11 being 16 KB.

Figure 10:
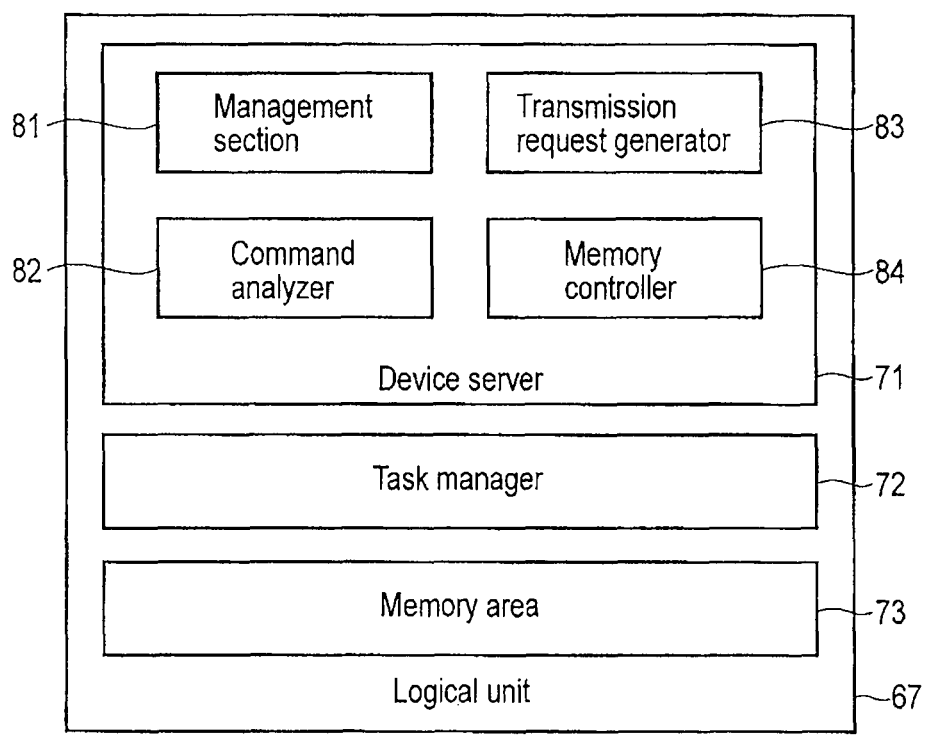
FIG. 10 illustrates functional blocks of an LU according to the first embodiment.
Figure 11:
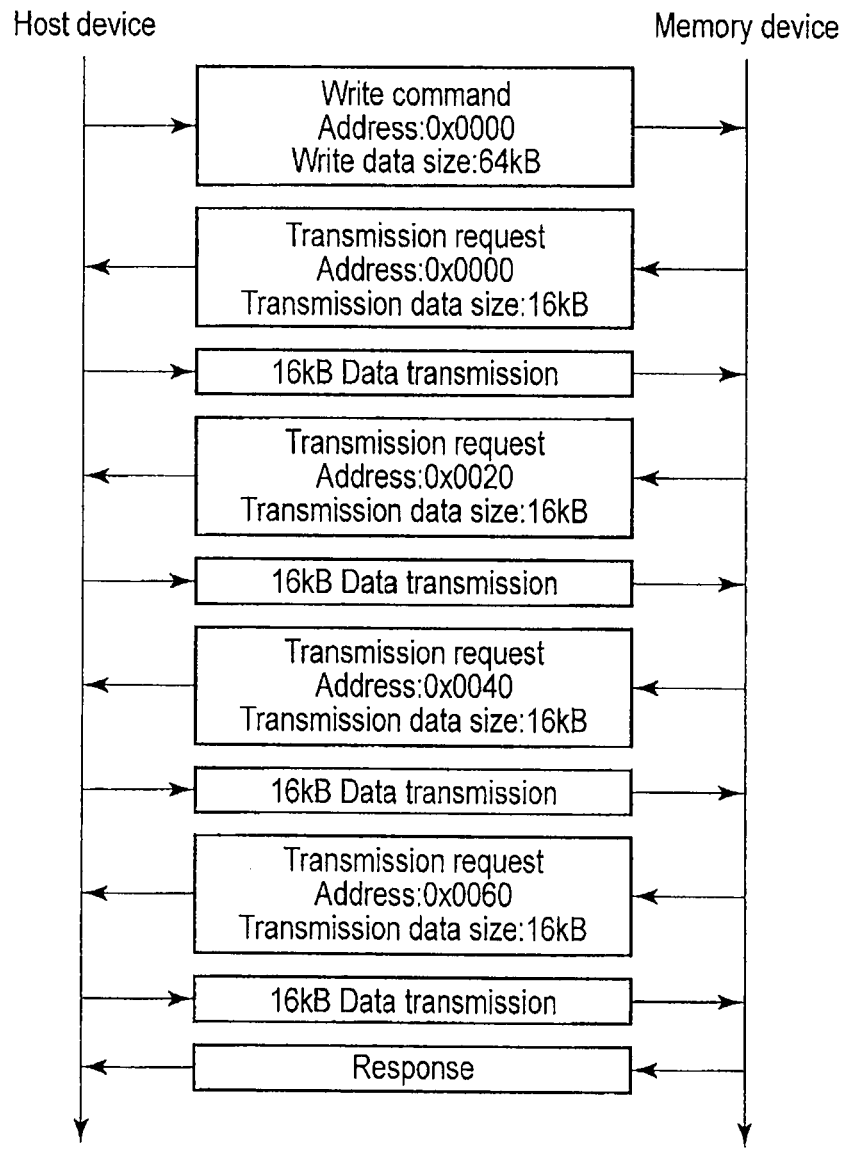
FIG. 11 illustrates communications during writing according to the first embodiment.

Referring to FIGS. 10 and 11, writing will now be described. FIG. 10 illustrates functional blocks in the LU 67 according to the first embodiment in detail. FIG. 11 illustrates communications during writing according to the first embodiment. At least one of the LUs 67, typically all of them, has configuration which will be described with reference to FIG. 10. As shown in FIG. 10, the device server 71 includes a management section 81, a command analyzer 82, a transmission request generator 83, and a memory controller 84.

The management section 81 manages the whole device server 71. The command analyzer 82 receives a command via the router 62 from the host 2. The command analyzer 82 analyzes the received command. Upon reception of a write command, the command analyzer 82 requests the transmission request generator 83 to determine (or, generate) a transmission request. Such a request to the transmission request generator 83 may be directly executed by the command analyzer 82 or executed by the management section 81. Upon reception of the request, the transmission request generator 83 generates a transmission request based on the size and address of the write data specified by the write command. The memory controller 84 is responsible for issuing all kinds of instructions to the memory 11 in accordance with instructions from the management section 81.

Referring to FIG. 11, a write sequence will now be described. This example relates to a write request to a particular LU 67, and therefore all communications travel between this particular LU 67 and the host 2.

As shown in FIG. 11, a write command is transmitted to the memory device 1 from the host 2. As shown in FIG. 12, a write command contains at least an LUN 102, a write instruction 111, an address 112, and a write data size 113. The address 112 specifies the position to which the write data will be written (or, a logical address). The write data size 113 indicates the size of the whole write data.

In the UFS memory system, communications such as data, commands, or queries are all carried in a packet. For the memory device 1 and host 2 being the UFS memory system, the write command corresponds to the command forward packet (Command UPIU). The command forward packet contains a header, a command description section in a substantial section of the packet, and a Small Computer System Interface (SCSI) command in the command description section. The SCSI command in turn contains a write command 111, an address 112, and a write data size 113.

The write command is received by the command analyzer 82 in the addressed LU 67. When the received command is a write command, the command analyzer 82 requests the transmission request generator 83 to generate a transmission request via the management section 81. Upon reception of the generation request, the transmission request generator 83 generates the transmission request in consideration of the nature of the memory 11, in particular the logical address and size of the write data. Specifically, the transmission request generator 83 first refers to the logical address of the write data to determine whether the write request corresponds to a request to write data from the head of a page to which the write data will be written. In the ongoing context, the logical address is 0x0000, which corresponds to a request to write data from the head of a block (in other words, a page). Upon learning this, the transmission request generator 83 requests the host 2 to transmit a segment of the write data of a size equal to the page size because the memory 11 writes data in units of pages, and therefore it can efficiently write data when it receives the write-data segments of the page size. In contrast, if the segment has a different size such as one half page size, the writing may be less efficient due to possible necessity of the excess of the segment to be buffered in a buffer temporarily. Thus, if the write request corresponds to a request to write data from the head of a page, the transmission request generator 83 requests transmission of a page-size segment of the write data from its head. Specifically, in the ongoing context, the transmission request for a 16-KB write-data segment from logical address 0x0000 is generated. The generated transmission request is transmitted to the host 2 via the management section 81 and router 62 as shown in FIG. 11. Note that, a case will be described for a write request not corresponding to a request to write data from the head of a page in the second embodiment.

The transmission request contains an LUN (header) 102, a transmission data address 121, and a transmission data size 122 as shown in FIG. 13. The transmission data address 121 specifies the offset address of the write-data segment requested by the LU 67. The transmission data size 122 indicates the size of the associated write-data segment. For the memory device 1 and host 2 being the UFS memory system, the transmission request corresponds to the transmission request packet (Ready To Transfer UPIU). The transmission request packet indicates that the LU 67 is ready for data transmission and contains the transmission data address 121 and transmission data size 122 in its substantial section.

Upon reception of the transmission request, the host 2 transmits the write-data segment according to the received transmission request as shown in FIG. 11. The data transmission contains an LUN (header) 102 and data 131 as shown in FIG. 14. For the memory device 1 and the host 2 being the UFS memory system, the data transmission is performed by the host data transmission packet (Data Out UPIU). The host data transmission packet contains the to-be-transmitted data in its substantial section.

The write-data segment from the host 2 is received by the memory device 2, specifically by a particular LU 67 which has issued the corresponding transmission request. The received write-data segment is written in a suitable position of the memory area 73 by control of the memory controller 84.

The transmission request generator 83 then generates the next transmission request. The transmission request requests transmission of the page-size write-data segment subsequent the first (leading) write-data segment. This second write-data segment corresponds to the 16-KB write-data segment from the logical address 0x0020. The transmission request is transmitted to the host 2. The corresponding data segment is then written to the memory area 73 with the same procedure as described with reference to the first data segment.

The same steps are repeated. Specifically, the transmission request generator 83 generates a request of transmission of the third 16-KB write-data segment from the logical address 0x0040 subsequent the second write-data segment. In response to this request, the corresponding data segment is written to the memory area 73. The transmission request generator 83 generates a request of transmission of the 16-KB last write-data segment from the logical address 0x0060 subsequent the third write-data segment. In response to this request, a corresponding data segment is written in the memory area 73. The last write-data segment also has a size of 16 KB because the write data has a size of an integral multiple of the page size and the write request corresponds to a request to write data from the head of a page. Upon completion of the transmission request and writing of the last write-data segment, the device server 71 (particularly, management section 81) of the corresponding LU 67 transmits the response indicative of successful writing to the host 2. Thus, data writing is completed.

As described above, the memory device 1 according to the first embodiment has an authority to determine the size of write-data segments to be transmitted in response to the write request from the host 2, and requests transmission of page-size write-data segments. This allows the write-data segment transmitted at a time to have the page size and have the head and end aligned with the head and end of a page to which the write data will be written, respectively. This in turn can allow the memory device 1 to receive a write-data segment in parallel to writing a previously received write-data segment to the memory 11. This is based on a capability of the memory to receive write data even the memory is in a busy state. With such a write sequence, the memory 11 can efficiently write data.

Moreover, a memory which prohibits writing to a data-written page before erasing it may suffer from reduced write efficiency if logical addresses and physical addresses would be translated in units larger than the memory page size and the host would not transmit a write-data segment of a size which can avoid writing in a part of a page whether data is already stored in an area to which data will be written or not. Assume that as an example for translation between the logical addresses and the physical addresses logical addresses from 0x0000 to 0x001F correspond to the physical address of the first page of the memory 11 (page size being 16 KB), and logical addresses from 0x0020 to 0x003F correspond to the physical address of the second page of the memory 11. When a 16-KB write-data segment from logical address 0x0010 is transmitted by the host, data from logical addresses 0x0010 to 0x001F is stored in the half of the first page, and data from the logical address 0x0020 to 0x002F is stored in the half of the second page. Then, when the memory device receives an 8-KB write-data segment of logical address 0x0000 from the host, it must read the data of logical addresses 0x0010 to 0x001F stored in the first page, and write both the read data and the write-data segment of logical addresses 0x0000 to 0x000F received from the host to a new or third page because it cannot overwrite the first page. After writing to the third page, the logical addresses from 0x0000 to 0x001F are associated with the physical address of the third page of the memory. Thus, writing to a part of a page requires the memory to copy existing write data to a new page when the memory receives a request for writing to an unwritten portion of a page from the host. Moreover, for translation between logical addresses and physical addresses in units of blocks of a memory, existing written data must be copied to a new block, which results in more remarkably reduced write efficiency.

In contrast, the write-data segment which the memory device 1 according to the first embodiment requests the host 2 to transmit has the page size and has the head of the logical address corresponding to the physical address of the head of a particular page, and has the end corresponding to the physical address of the end of the page. This avoids writing to a part of a page, which in turn can avoid reduced write efficiency due to copy of written data.

Moreover, the ECC circuit 36 adds the error correction code to the write data as described above. Specifically, the ECC circuit 36 divides a received write-data segment into segments, which may be referred to as a substantial data segment, with a size determined based on details such as the nature of the ECC circuit 36. The ECC circuit 36 generates ECCs for respective substantial data segments, and adds them to respective substantial data segments. In other words, a substantial data segment is a unit used for ECC processing. A set of a substantial data segment, a corresponding ECC, and corresponding management data may be referred to as a frame. The frame is output from the ECC circuit 36. A particular device server 71 corresponding to the addressed LU associated with write data buffers frames received from the ECC circuit 36 in the buffer 35 based on a request to write data for the frames. Once a particular number of the frames are buffered in the buffer 35, a corresponding device server 71 writes the frames to a corresponding memory area 73.

Figure 18:
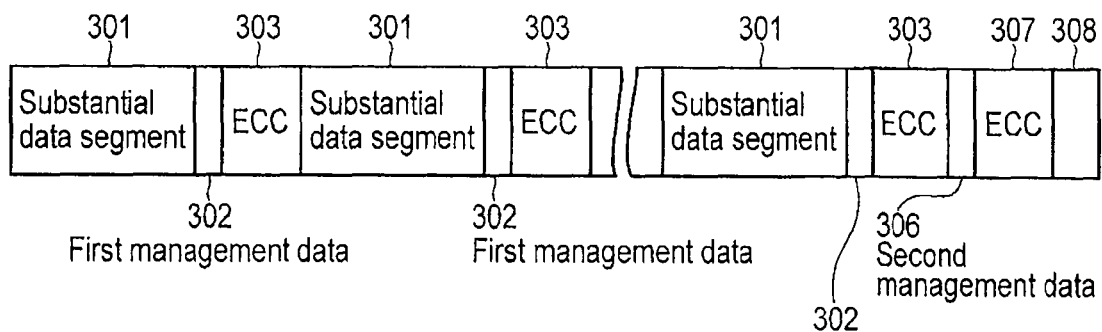
FIG. 18 illustrates a format of data in one page according to the first embodiment.

The memory device 1 takes into consideration the sizes of one frame and various necessary management data to determine the size of the write-data segment. Specifically, memory device 1 requests possible largest write-data segment while smaller than the combined size of the write-data segment and corresponding all additional data (e.g., ECC, management data). FIG. 18 illustrates a format of the data in one page of the memory device 1 according to the first embodiment. The memory device 1 request the write-data segment of the size determined to allow it to have a format as shown in FIG. 18 when written to the page. As shown in FIG. 18, one frame consists of substantial data segments 301, corresponding management data items 302, and corresponding ECCs 303. FIG. 18 illustrates the substantial data segment 301 of 1024 bytes, management data 302 of 2 bytes, and ECC 303 of 76 bytes. Each page may need to contain management data 306, to which its ECC 307 may be added. The management data 306 and ECC 307 may have 8 bytes and 76 bytes in size, respectively. The memory device 1 requests the write-data segment of the size determined to allow the remaining unused portion 308 of the page without the substantial data segments 301 of the write-data segment and first additional data (e.g., the ECCs 303 and 307 and management data 302 and 306) to be smaller than the combined size of one substantial data segment 301 and second additional data (e.g., the ECC 303 and management data 302) for the substantial data segment 301. With the write-data segment of such a size, a page can be used most efficiently.

The applied ECC system uses its own fixed size of the ECC processing unit, which corresponds to the size of the substantial data segment 301. Similarly, the sizes of the management data 302, ECC 303, and management data 307 are also fixed. Therefore, one page can contain the fixed maximum number of the substantial data segments 301 determined based on the size of the ECC processing unit. The combined size of the substantial data segments 301 of such a number may be referred to as a largest total substantial-data-segment size.

Second Embodiment

The second embodiment relates to a write request not corresponding to writing data from the head of a page. The memory device according to the second embodiment has the same hardware configuration (FIG. 3) and functional blocks (FIG. 7) as the first embodiment. Referring to FIG. 15, respects in a write sequence different from the first embodiment will be described. For matters not described for the second embodiment, all description for the first embodiment is applied.

FIG. 15 illustrates communications during writing according to the second embodiment. As shown in FIG. 15, the write request by the host 2 corresponds to writing data from partway through a page. This is represented by the logical address of the write data being 0x0010 in FIG. 15 (here, translation between logical addresses and physical addresses assumes that the logical addresses from 0x0000 to 0x001F correspond to the physical address of a page of the memory 11). In addition, the write data has a size of 64 KB. The command analyzer 82 analyzes the received write command, and recognizes that the write request corresponds to writing data from somewhere other than the head of a page. The command analyzer 82 then requests a segment of size corresponding to one from the head of the write data to the end of the page to which the segment will be written as the first write-data segment. Specifically, in the ongoing context, the first write-data segment consists of an 8-KB segment of the write data from its head, and more specifically it has a logical address from 0x0010 and a size of 8 KB. The transmission request is received by the host 2, and accordingly the requested write-data segment is received by the corresponding device server 71. The received write-data segment is written to the corresponding memory area 72.

The transmission request generator 83 then generates a transmission request for the second write-data segment. The end of the first write-data segment is aligned with the end of a page to which the segment will be written. For this reason, using subsequent write-data segments with the page size can align the respective ends of them with the respective ends of pages to which the segments will be written. Specifically, the second write-data segment starts from the logical address 0x0020 and has a size of 16 KB. The transmission request of such a write-data segment is transmitted to the host 2, and then the corresponding write-data segment is written in the memory area 72. Then, a transmission request of the third 16-KB write-data segment which starts from logical address 0x0040 is similarly transmitted to the host 2, and the corresponding write-data segment is written to the memory area 72. A transmission request of the fourth 16-KB write-data segment which starts from logical address 0x0060 is then transmitted to the host 2, and the corresponding write-data segment is written to the memory area 72. A transmission request of the remainder of the write data and writing thereof to the memory area 72 occur. In the ongoing context, the last write-data segment starts from logical address 0x0080, and has a size of 8 KB. The transmission request of such a data segment is transmitted to the host 2, and the corresponding write-data segment is written to the memory area 72. The response indicative of successful writing is transmitted to the host 2.

The generalization of the writing scheme as described above is as follows. Assume that N (bytes in unit) refers to the page size. When the memory device 1 receives a write request for X blocks (one block having 512 bytes) from address Y (512 bytes in unit) from the host 2 and Integer (Y×512/N) is smaller than Integer ((Y+X−1)×512/N), which corresponds to the write data unable to fit in a page, it requests the first write-data segment which starts from the head of the write data and size ((Integer(Y×512/N)+1)×N)−Y×512 bytes. Note that Integer(P) refers to a function which extracts the integer of P with P being any number. The memory device 1 writes the first write-data segment in the memory area 72. The memory device 1 then transmits transmission requests of N-bytes write-data segments subsequent to the first write-data segment to the host 2 and writing transmitted write-data segments for Integer((Y+X−1)×512/N)−Integer(Y×512/N)−1 times one by one. Finally, the memory device 1 performs transmission request of the remaining write-data segment of size (Y+X)×512−Integer((Y+X−1)×512/N)×N bytes to the host 2 and writing the transmitted write-data segment. When Integer (Y×512/N) is equal to Integer ((Y+X−1)×512/N), which corresponds to the write data able to fit in a page, the memory device 1 requests the first write segment, which starts from the head of the write data and has size X×512 bytes, and then writes the transmitted data. The above description discusses one block of 512 bytes; however it can be generalized using M instead of 512 bytes.

As described above, when the memory device according to the second embodiment receives a request corresponding to writing data from partway through a page, it requests the first segment of a size corresponding to one to the end of a page in which the write data will be written. The memory device then requests transmission of write-data segments of the page size. As a result, even with a request corresponding to writing data from partway through a page, each succeeding write-data segment has the page size and has its head and end aligned with the head and end of a page to which it will be written. This allows the memory 11 to write data efficiently by the same principle as the first embodiment.

The write-data segment of a size determined in consideration of the additional data can also be used in the second embodiment. The second embodiment relates to a write request corresponding to writing data from partway through a page. For this reason, the command analyzer 82 requests the first write-data segment of the largest size while smaller than the size from the head of the write data to the end of a page to which the data segment will be written. The second and succeeding write-data segments have the same size as the largest total substantial-data-segment described above.

Third Embodiment

Figure 16:
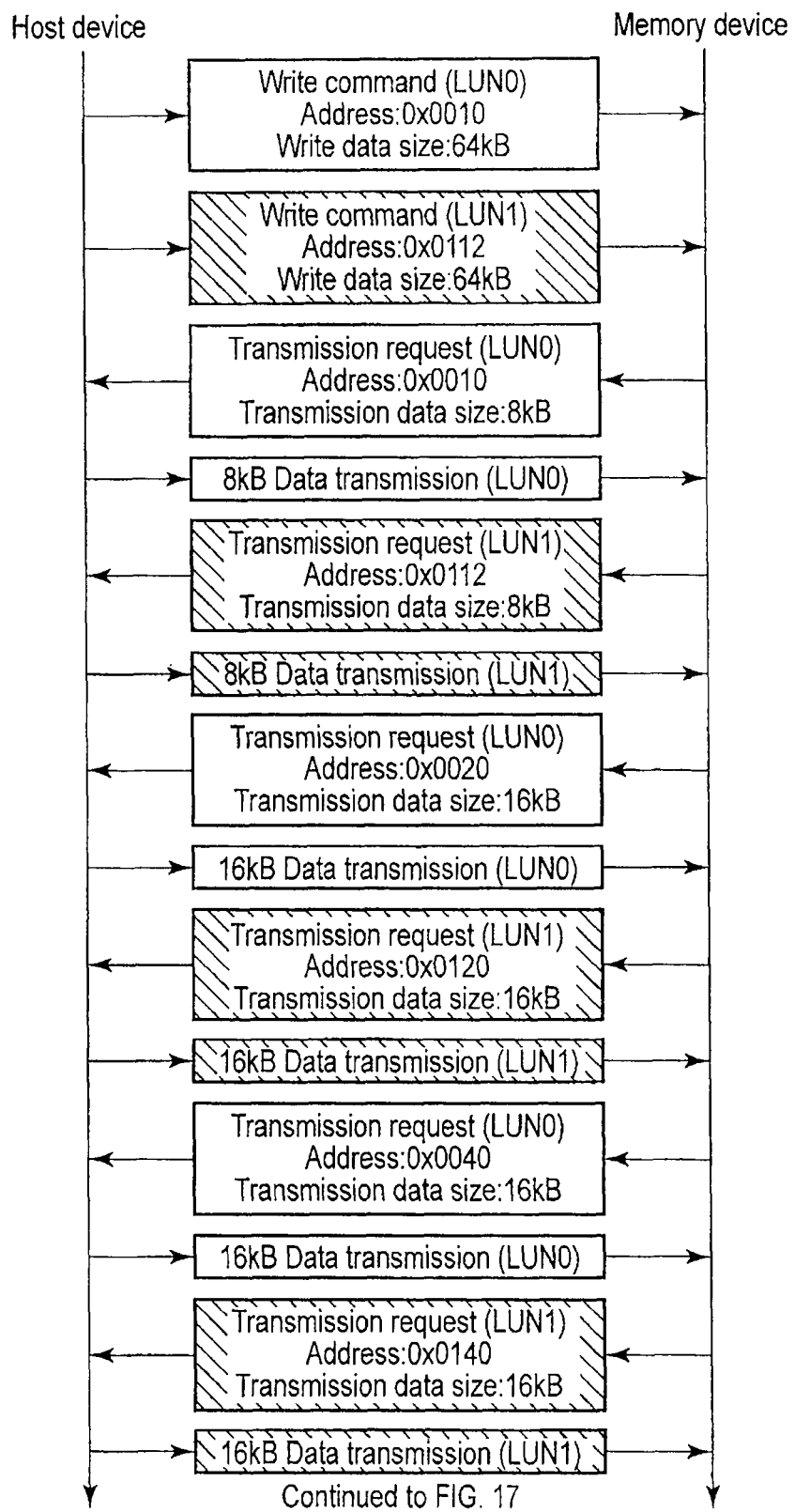
FIG. 16 illustrates an initial part of communications during writing according to a third embodiment.
Figure 17:
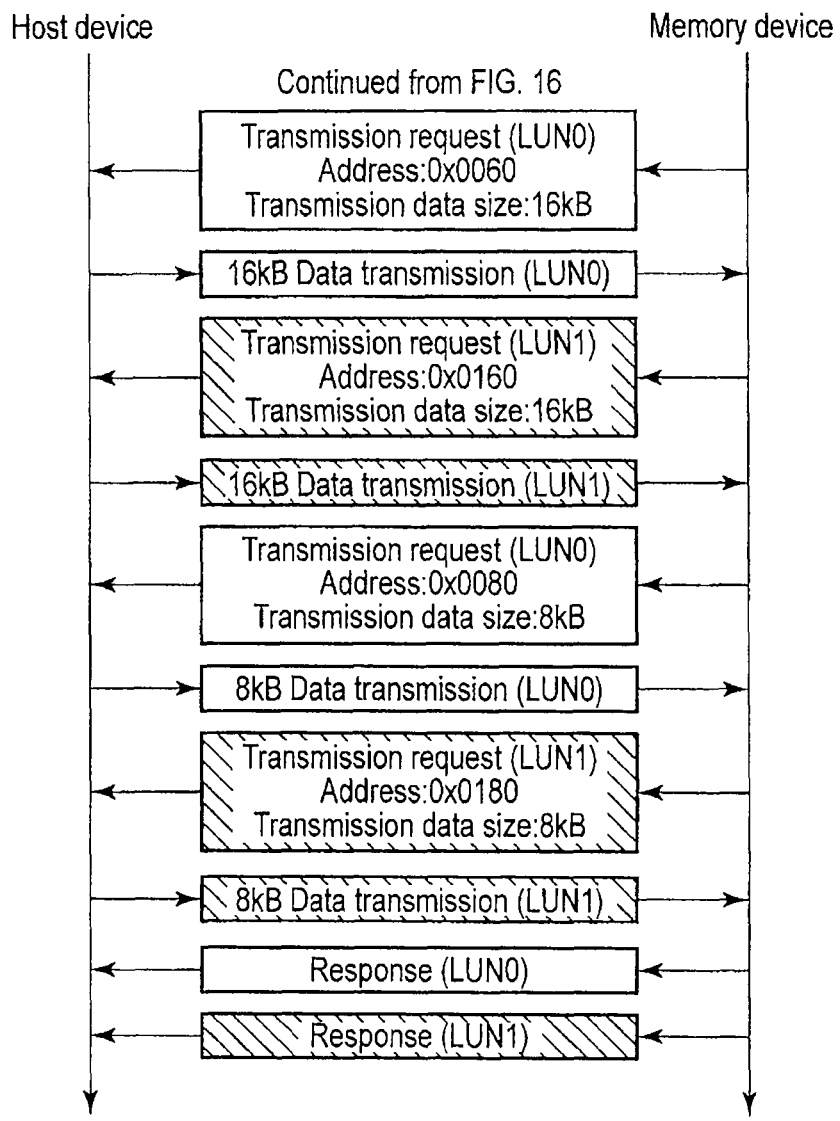
FIG. 17 illustrates the remaining part of communications during writing according to the third embodiment.

The third embodiment relates to parallel writing to two LU. The memory device according to the third embodiment has the same hardware configuration (FIG. 3) and functional blocks (FIG. 7) as the first embodiment. Referring to FIG. 16 and FIG. 17, respects in a write sequence different from the first embodiment will be described. For matters not described for the third embodiment, all description for the first embodiment is applied.

FIGS. 16 and 17 illustrate communications during writing according to the third embodiment. FIG. 17 succeeds to FIG. 16. As shown in FIG. 16, the host 2 transmits a command which requests write data of logical address 0x0010 to be written to the LU 67 of LUN0 (the first LU) to the first LU 67. This write command corresponds to a request to write data from partway through a page as in the second embodiment. The write data has a size of 64 KB. The host 2 then transmits a command which requests write data of logical address 0x0112 to be written to the LU 67 of LUN1 (the second LU) to the second LU 67. This write command also corresponds to a request to write data from partway through a page. The write data also has a size of 64 KB. In subsequent processing, processing between the first LU 67 and the host 2 and one between the second LU 67 and the host 2 progress in parallel. The following discussion assumes that a communication between first LU 67 and the host 2 and one between the second LU 67 and the host 2 occur in turn. Such alternate occurrence, however, is not necessary. The order of the communication for the first LU 67 and one for second LU 67 is controlled by the router 62.

The command analyzer 82 of the first LU 67 analyzes the received write command and learns that the write request corresponds to a request to write data from partway through a page as in the second embodiment. The command analyzer 82 then requests the first segment of a size corresponding to one from the head of the write data to the end of a page to which the segment will be written. Specifically, in the ongoing context, the first write-data segment for the first LU 67 consists of an 8-KB segment of the write data from its head, and more specifically it has a logical address 0x0010 and a size of 8 KB. The transmission request is received by the host 2, and then the requested write-data segment is received by the corresponding device server 71. The received write-data segment is written to the memory area 73 in the first LU 67.

The command analyzer 82 of the second LU 67 also learns that the write request requests to write data from partway through a page. The command analyzer 82 then requests the first segment of a size corresponding to one from the head of the write data to the end of a page to which the segment will be written. Specifically, in the ongoing context, the first write-data segment for the second LU 67 consists of a 7-KB segment of the write data from its head, and more specifically it has a logical address 0x0112 and a size of 7 KB. The transmission request is received by the host 2, and then the requested write-data segment is received by the corresponding device server 71. The received write-data segment is written to the memory area 73 in the second LU 67.

The command analyzer 82 of the first LU 67 generates a request of transmission of the second 16-KB write-data segment which has a logical address subsequent to the first write-data segment, i.e., which starts from logical address 0x0020. In response to this, the corresponding data segment is written to the memory area 73 in the first LU 67.

The command analyzer 82 of the second LU 67 generates a request of transmission of the second 16-KB write-data segment which has a logical address subsequent to the first write-data segment, i.e., which starts from logical address 0x0120. In response to this, the corresponding data segment is written to the memory area 73 in the second LU 67.

In a similar manner, a set of transmission request and writing is repeated for the third write-data segment for the first LU 67, the third write-data segment for the second LU 67, the fourth write-data segment for the first LU 67, and the fourth write-data segment for the second LU 67 in the mentioned order.

Transmission request and writing to the memory 11 is then executed for the remainder of the write data for the first LU 67, i.e., the segment subsequent to the fourth write-data segment. In the ongoing context, the last write-data segment starts from logical address 0x0080 and has a size of 8 KB. The transmission request for such a data segment is transmitted to the host 2, and the corresponding write-data segment is written to the memory area 73.

Similarly, transmission request and writing to the memory 11 is executed for the remainder of the write data for the second LU 67, i.e., the segment subsequent to the fourth write-data segment. In the ongoing context, the last write-data segment starts from logical address 0x0180 and has a size of 9 KB. The transmission request for such a data segment is transmitted to the host 2, and the corresponding write-data segment is written to the memory area 73.

A response indicative of successful writing to the first LU 67 is transmitted to the host 2 from the first LU 67, and a response indicative of successful writing to the second LU 67 is transmitted to the host 2 from the second LU 67.

As described above, when the memory device 1 according to the third embodiment receives a request corresponding to writing data from partway through a page, it requests the first write-data segment of a size corresponding to the end of a page to which the write data will be written for each LU as in the second embodiment. The memory device 1 then requests transmission of write-data segments of the page size for each LU. This can also provide the same advantages as the first and second embodiments for data write requests to two or more LUs by the same principle as the first and second embodiments.

The description for the write-data segment of a size determined in consideration of the additional data for the first and the second embodiments can also be applied to the third embodiment. Specifically, the first write-data segment is requested similarly to the second embodiment in response to a write request corresponding to writing data from partway through a page for each LU. The second and succeeding write-data segments have the same size as the largest total substantial-data-segment described above.

Embodiments are not limited to those described herein and can be variously modified at the practical stages unless they deviate from their spirit. They include various stages, and various embodiments can be extracted from appropriate combinations of the components disclosed herein. Even if some components are omitted from all components described herein, arrangements without such omitted components can also be extracted as embodiments.

For example, the write-data segment which the memory device 1 requires the host 2 to transmit has the page size of the memory 11 in the above embodiments; however it may be an integral multiple of the page size. Moreover, when a write request does not corresponds to a request to write data from the head of a page, the first write-data segment has a size corresponding to one from the head of the write data to the end of a page to which the write-data segment will be written in the above embodiments; however it may have the combined size of a size corresponding to the end of a page to which the data will be written and one or more page sizes.

The same applies to the additional data considered. Specifically, a write-data segment may have multiple integral of the largest total substantial-data-segment size. Furthermore, in response to a write request corresponding to a request to write data from partway through a page for each LU, the first write-data segment may have the combined size of the largest while smaller than the size from the head of the write data to the end of a page to which the data segment will be written and one or more largest total substantial-data segment sizes.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A memory device comprising:
   a memory to which data is written using memory cells as a write unit; and
   a controller which, in response to a request to write data with a logical address to the memory from a host device, requests the host device to transmit a segment of the write data with a size of the segment of the write data specified by the controller, wherein
   when the controller receives the segment of the write data, the controller
      respectively prepares additional data pieces for sections of the segment of the write data, and
      writes the segment of the write data and the additional data pieces for the sections of the segment of the write data to the memory,
   each of the sections of the segment of the write data has a same fixed size,
   each of the additional data pieces has a same fixed size, and
   the segment of the write data has a first size determined to allow a combined size of the segment of the write data and the additional data pieces for the sections of the segment of the write data to be largest among sizes that are smaller than the size of the write unit or the segment of the write data has a size of a multiple integral of the first size.

2. The device of claim 1, wherein
   each of the additional data pieces comprises at least one of management data for a corresponding one of the sections of the segment of the write data and an error correcting code for that corresponding one of the sections of the segment of the write data.

3. The device of claim 2, wherein
   the controller comprises an error correcting code circuit which generates error correcting codes in units of correction units, and a size of each of the correction units is equal to a size of each of the sections of the segment of the write data.

4. The device of claim 3, wherein
   a size of the write unit without the combined size of the segment of the write data and the additional data pieces for the sections of the segment of the write data is smaller than a combined size of one of the correction units and an additional data piece for that correction unit.

5. The device of claim 1, wherein
   the first size is a size determined to allow the combined size of the segment of the write data and the additional data pieces for the sections of the segment of the write data to be largest among sizes smaller than the size of the write unit.

6. The device of claim 1, wherein the memory device comprises a universal flash storage (UFS) memory device.

7. The device of claim 1, wherein
   the memory device comprises a first logical unit and a second logical unit,
   the first and second logical units comprise respective parts of a function of the controller and respective parts of memory space of the memory, and
   the first and second logical units independently write data in respective memory areas thereof and transmit respective transmission requests.

8. The device of claim 1, wherein
   the controller requests transmission of the write data with an initial segment of the write data with a second size, one or more subsequent segments with a third size, and a last segment with a fourth size, the third size is larger than the second size, and the fourth size is smaller than the third size.

9. The device of claim 8, wherein the second size is determined to be largest among sizes smaller than the size of the write unit to which the initial segment will be written from the initial segment to an end of the write unit.

10. The device of claim 9, wherein the third size is determined to allow a combined size of the one or more subsequent segments and additional data pieces for sections of the one or more subsequent segments to be largest among sizes smaller than the size of the write unit.

11. The device of claim 8, wherein each of the additional data pieces comprises at least one of management data for a corresponding one of the sections of the segment of the write data and an error correcting code for that corresponding one of the sections of the segment of the write data.

12. The device of claim 11, wherein the controller comprises an error correcting code circuit which generates error correcting codes in units of correction units, and a size of each of the correction units is equal to a size of each of the sections of the segment of the write data.

13. The device of claim 8, wherein the memory device comprises a universal flash storage (UFS) memory device.

14. The device of claim 8, wherein the memory device comprises a first logical unit and a second logical unit, the first and second logical units comprise respective parts of a function of the controller and respective parts of memory space of the memory, and the first and second logical units independently write data in respective memory areas thereof and transmit respective transmission requests.

15. A memory device comprising:

a memory to which data is written using memory cells as a write unit; and a controller which, in response to a request to write data with a logical address to the memory from a host device, requests the host device to transmit a segment of the write data with a size of the segment of the write data specified by the controller, wherein when the controller receives the segment of the write data, the controller respectively prepares additional data pieces for sections of the segment of the write data, and writes the segment of the write data and the additional data pieces for the sections of the segment of the write data to the memory, each of the sections of the segment of the write data has a same fixed size, each of the additional data pieces has a same fixed size, and the segment of the write data has a size of an integral multiple of a size of the write unit.

16. The device of claim 15, wherein the controller requests transmission of the write data with an initial segment of the write data with a first size, one or more subsequent segments with a second size, and a last segment with a third size, the second size is larger than the first size, and the third size is smaller than the second size.

17. The device of claim 16, wherein the write unit has size N-bytes, and when the controller receives the write request for X blocks (one block being size M-bytes) from a logical address Y (M bytes in unit) and Integer $(Y \times M/N)$ is smaller than Integer $((Y+X-1) \times M/N)$, the controller:

requests transmission of a first segment of the write data which has size $((\text{Integer}(Y \times M/N)+1) \times N) - Y \times M$ bytes from a head of the write data, wherein Integer $(Y/N)$ is a function to extract integer of $Y/N$;

requests transmission of N-bytes second segments of the write data subsequent the first segment of the write data for Integer$((Y+X-1) \times M/N)$−Integer$(Y \times M/N)$−1 times one by one; and requests transmission of a third segment of the write data of a size $(Y+X) \times M - \text{Integer}((Y+X-1) \times M/N) \times N$ bytes.

18. The device of claim 15, wherein the memory device comprises a first logical unit and a second logical unit, the first and second logical units comprise respective parts of a function of the controller and respective parts of memory space of the memory, and the first and second logical units independently write data in respective memory areas thereof and transmit respective transmission requests.

19. The device of claim 15, wherein the segment of the write data has a same size as the write unit, and the segment of the write data written in the memory has a head and end aligned with the head and end of one write unit to which the write data is written, respectively.

* * * * *